(12) United States Patent
Neznanov et al.

(10) Patent No.: US 8,397,143 B2
(45) Date of Patent: Mar. 12, 2013

(54) BCH OR REED-SOLOMON DECODER WITH SYNDROME MODIFICATION

(75) Inventors: Ilya V. Neznanov, Moscow (RU); Elyar E. Gasanov, Moscow (RU); Pavel A. Panteleev, Moscow (RU); Pavel A. Aliseychik, Moscow (RU); Andrey P. Sokolov, Moscow (RU)

(73) Assignee: LSI Corporation, San Jose, CA (US)

( * ) Notice: Subject to any disclaimer, the term of this patent is extended or adjusted under 35 U.S.C. 154(b) by 616 days.

(21) Appl. No.: 12/624,664

(22) Filed: Nov. 24, 2009

(65) Prior Publication Data

US 2010/0299580 A1  Nov. 25, 2010

(30) Foreign Application Priority Data

May 22, 2009  (RU) ................................ 2009119260

(51) Int. Cl.
*H03M 13/00*  (2006.01)
(52) U.S. Cl. ......................... 714/785; 714/784
(58) Field of Classification Search .................. 714/784, 714/785
See application file for complete search history.

(56) References Cited

U.S. PATENT DOCUMENTS

| | | | |
|---|---|---|---|
| 5,170,399 A | 12/1992 | Cameron et al. ............. | 371/37.1 |
| 5,537,429 A | 7/1996 | Inoue ........................... | 371/37.1 |
| 5,805,616 A * | 9/1998 | Oh ................................ | 714/784 |
| 6,353,909 B1 | 3/2002 | Amrany et al. ............... | 714/757 |
| 6,415,413 B1 | 7/2002 | Pan et al. ...................... | 714/784 |
| 6,539,515 B1 | 3/2003 | Gong ............................ | 714/784 |
| 7,047,481 B2 * | 5/2006 | Marconetti ................... | 714/784 |
| 7,366,969 B2 | 4/2008 | Dong et al. ................... | 714/784 |
| 7,385,532 B1 | 6/2008 | Schumacher .................. | 341/51 |
| 2003/0041300 A1 | 2/2003 | Burns et al. .................. | 714/784 |
| 2003/0097632 A1 * | 5/2003 | Marconetti ................... | 714/784 |
| 2005/0193312 A1 | 9/2005 | Smith et al. .................. | 714/755 |
| 2005/0278610 A1 * | 12/2005 | Banks .......................... | 714/784 |
| 2006/0174181 A1 * | 8/2006 | Banks et al. .................. | 714/784 |
| 2007/0143659 A1 | 6/2007 | Ball ............................. | 714/755 |
| 2010/0031127 A1 * | 2/2010 | Panteleev et al. ............. | 714/784 |
| 2010/0281344 A1 * | 11/2010 | Gasanov et al. .............. | 714/784 |

OTHER PUBLICATIONS

Moon, Todd K., "Error Correction Coding: Mathematical Methods and Algorithms", John Wiley & Sons, Inc. Publisher, 2005, pp. 253-255.

* cited by examiner

*Primary Examiner* — Charles Ehne
(74) *Attorney, Agent, or Firm* — Christopher P. Maiorana, PC

(57) ABSTRACT

An apparatus generally having a first circuit, a second circuit and a third circuit is disclosed. The first circuit may be configured to calculate a plurality of preliminary syndromes from a plurality of received symbols. The second circuit may be configured to calculate a plurality of normal syndromes by modifying the preliminary syndromes using at most two Galois Field multiplications. The third circuit is generally configured to calculate an errata polynomial based on the normal syndromes.

20 Claims, 5 Drawing Sheets

BCH OR REED-SOLOMON DECODER WITH SYNDROME MODIFICATION

This application claims the benefit of Russian Application No. 2009119260, filed May 22, 2009 and is hereby incorporated by reference in its entirety.

FIELD OF THE INVENTION

The present invention relates to error-correcting decoding generally and, more particularly, to a method and/or apparatus for implementing a BCH or Reed-Solomon decoder with syndrome modification.

BACKGROUND OF THE INVENTION

BCH codes are well known and powerful class of block error-correcting codes. The BCH codes are widely used in numerous applications, such as data storage systems, network and wireless communications. A feature of the BCH codes is that information is transmitted in blocks of symbols of a predefined length. An encoder adds extra parity symbols to each block of information to produce a codeword. Some symbols in the codeword sometimes become corrupted when the codeword is transmitted through a noisy channel. A decoder accepts the corrupted codeword and uses the parity symbols to recover from the errors added by the channel. Two parameters are used by a BCH encoder and a BCH decoder, a codeword length and a maximum error limit. The codeword length is the length of the information block plus the amount of parity symbols. The maximum error limit defines whether the decoder is able to correct a corrupted received block or not. If the channel adds no more errors than the maximum error limit, the decoder guarantees proper recovery of the data, otherwise the decoder can fail to correct the errors or provide the wrong results.

SUMMARY OF THE INVENTION

The present invention concerns an apparatus generally having a first circuit, a second circuit and a third circuit. The first circuit may be configured to calculate a plurality of preliminary syndromes from a plurality of received symbols. The second circuit may be configured to calculate a plurality of normal syndromes by modifying the preliminary syndromes using at most two Galois field multiplications. The third circuit is generally configured to calculate an errata polynomial based on the normal syndromes.

The objects, features and advantages of the present invention include providing a method and/or apparatus for implementing a BCH or Reed-Solomon decoder with syndrome modification that may (i) provide a small complexity of additional components to a decoder, (ii) utilize at most two Galois Field multipliers in some embodiments and/or (iii) utilize at most one Galois field multiplier in other embodiments.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Embodiments of the present invention generally concern a hardware-based approach that may be used to build a configurable BCH decoder and/or a Reed-Solomon decoder with variable codeword lengths. Some embodiments may implement a syndrome modification technique using at most two extra Galois Field (GF) multipliers. The syndrome modification technique may be implemented with a single GF-multiplier in other embodiments. The syndrome modification technique is generally suitable for use with some key equation solving techniques, for instance, the Berlekamp-Massey technique. Implementations of the syndrome modification technique generally provide small complexity of additional components to a BCH decoder and/or a Reed-Solomon decoder.

Figure 1:
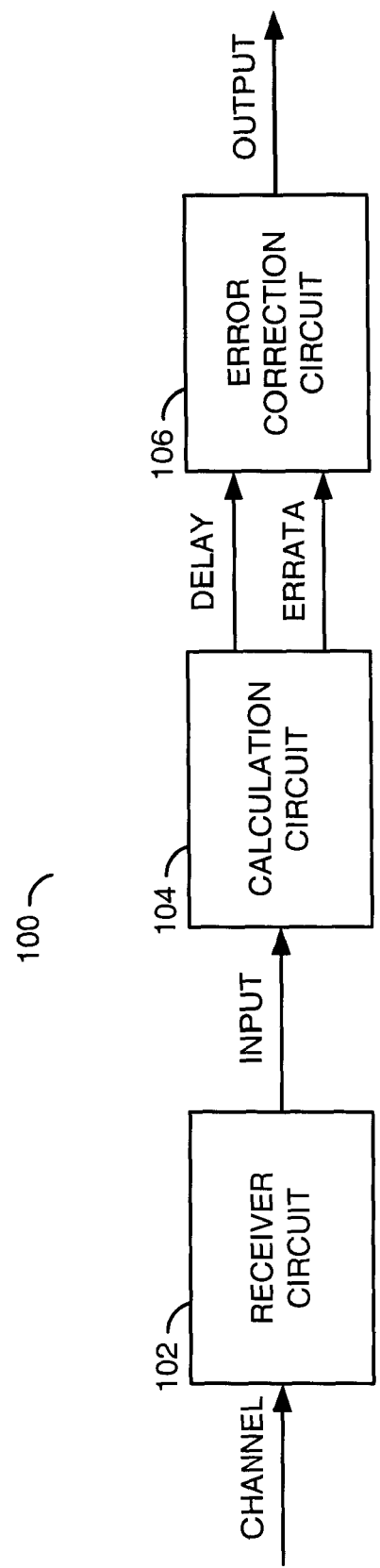
FIG. 1 is a block diagram of an example implementation of an apparatus.

Referring to FIG. 1, a block diagram of an example implementation of an apparatus 100 is shown. The apparatus 100 may be configured as a BCH decoder and/or a Reed-Solomon decoder. The apparatus 100 may also be referred to as a circuit or a system. In some embodiments, the apparatus 100 may be implemented in hardware-only designs. The apparatus 100 generally comprises a circuit 102, a circuit 104 and a circuit 106. The circuits 102 to 106 may represent modules and/or blocks that may be implemented as hardware, software, a combination of hardware and software, or other implementations.

A signal (e.g., CHANNEL) may be received by the circuit 102. The signal INPUT may be generated by the circuit 102 and presented to the circuit 104. A signal (e.g., DELAY) may be generated by the circuit 104 and presented to the circuit 106. A signal (e.g., ERRATA) may also be generated by the circuit 104 and presented to the circuit 106. The circuit 106 may generate and present the signal OUTPUT.

The signal INPUT may convey a received codeword, also referred to as a vector $V=(V_0, V_1, \ldots, V_{N-1})$. The received codeword may have been encoded per the BCH coding or the Reed-Solomon coding and transmitted through the noisy signal CHANNEL to the circuit 102. The signal DELAY may convey a delayed copy of the received codeword. The signal ERRATA may convey an errata polynomial $E(x)$. The errata polynomial is generally calculated based on syndromes of the received codeword. The signal OUTPUT may convey a reconstructed codeword $C(x)$.

The circuit 102 generally implements a receiver circuit. The circuit 102 may be operational to covert a sequence of symbols received through the signal CHANNEL into the signal INPUT. Generation of the signal INPUT may be performed by common techniques.

The circuit 104 may implement a calculation circuit. The circuit 104 is generally operational to calculate the signal ERRATA based on the received codeword, delay the received codeword while the errata polynomial is being calculated, and present the delayed codeword in the signal DELAY. In some embodiments, the circuit 104 may calculate (i) a plurality of preliminary syndromes from a plurality of received symbols, (ii) a plurality of normal syndromes by modifying said preliminary syndromes using at most two Galois field multiplications and (iii) an errata polynomial based on said normal syndromes using a solver circuit.

The circuit 106 generally implements an error correction circuit. The circuit 106 may be operational to create the recovered codeword in the signal OUTPUT by summing the signal ERRATA and the signal DELAY (e.g., C(x)=V(x)+E(x)). While the operations of the apparatus 100 are generally described in terms of recovering a received codeword, the techniques may be applied to a sequence of received codewords to obtain a sequence of recovered codewords.

Figure 2:
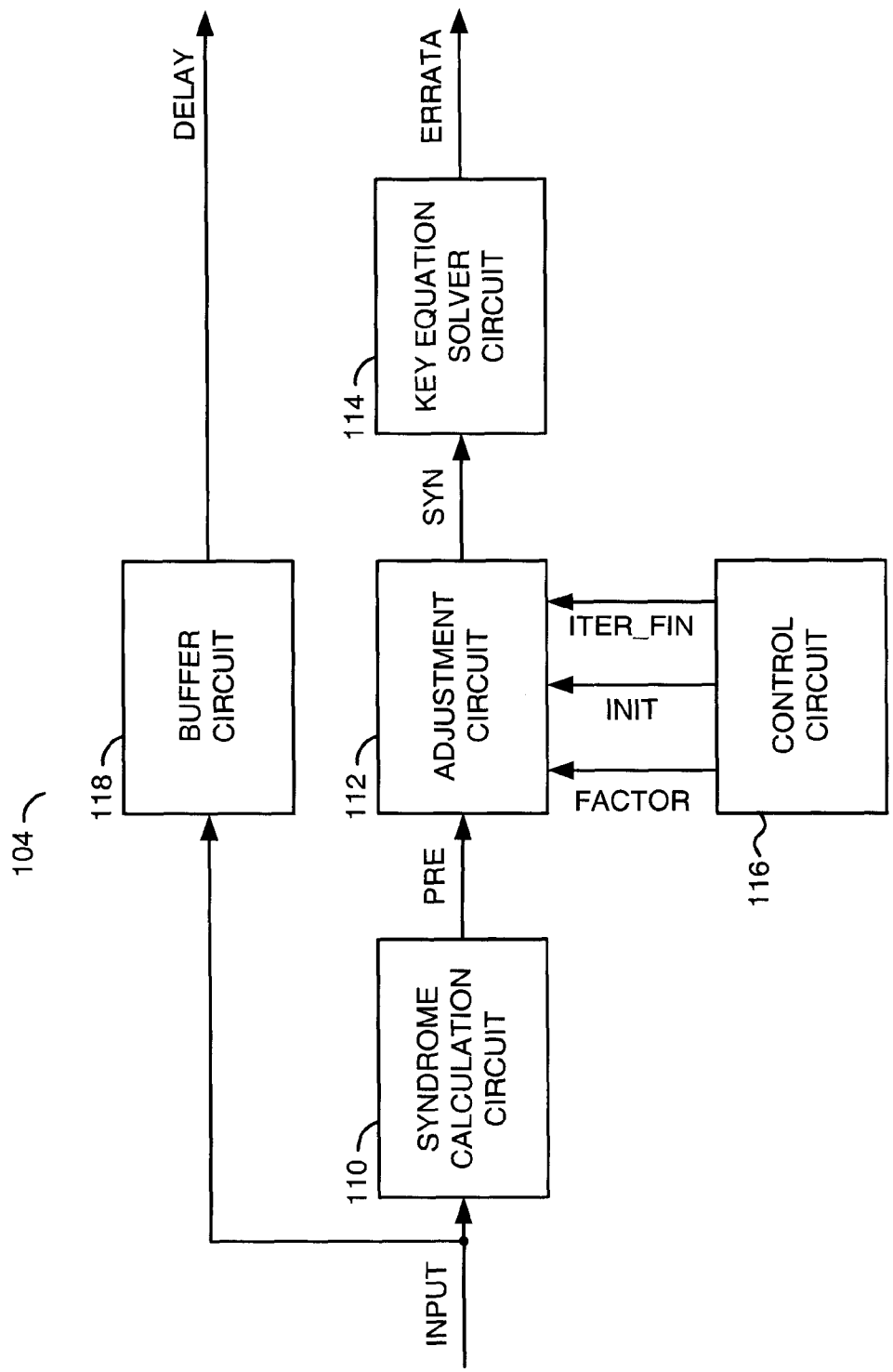
FIG. 2 is a block diagram of an example implementation of a calculation circuit of the apparatus in accordance with a preferred embodiment of the present invention.

Referring to FIG. 2, a block diagram of an example implementation of the circuit 104 is shown in accordance with a preferred embodiment of the present invention. The circuit 104 generally comprises a circuit 110, a circuit 112, a circuit 114, a circuit 116 and a circuit 118. The circuits 110 to 118 may represent modules and/or blocks that may be implemented as hardware, software, a combination of hardware and software, or other implementations.

The signal INPUT may be received by the circuit 110 and the circuit 118. The circuit 110 may generate a signal (e.g., PRE) that is received by the circuit 112. A signal (e.g., SYN) may be generated by the circuit 112 and transferred to the circuit 114. The circuit 114 may generate the signal ERRATA. The circuit 128 may generate the signal DELAY. A signal (e.g., FACTOR) may be generated by the circuit 116 and presented to the circuit 112. The circuit 116 may also generate a signal (e.g., INIT) that is received by the circuit 112. An optional signal (e.g., ITER_FIN) may be created by the circuit 116 and transferred to the circuit 112.

The circuit 110 may implement a syndrome calculator. The circuit 110 is generally operational to calculate multiple preliminary syndromes from the received codeword. The preliminary syndromes may be conveyed by the signal PRE. The signal PRE may carry the preliminary syndromes in a parallel manner.

The circuit 112 may implement an adjustment circuit. The circuit 112 is generally operational to calculate normal syndromes from the preliminary syndromes. The calculations may be based on one or more multiplication factor values received in the signal FACTOR. The circuit 112 may be set into an initial condition by the signal INIT. Where implemented, the calculations of the normal syndromes may be based in part on a condition of the signal ITER_FIN.

The circuit 114 generally implements a key equation solver circuit. The circuit 114 may be operational to perform a key equation solving technique. Examples of key equation solving techniques include, but are not limited to, the Berlekamp-Massey technique, the Euclidian technique and the Peterson technique. Other key equation solving techniques may be implemented to meet the criteria of a particular application.

The circuit 116 may implement a control circuit. The circuit 116 is generally operational to generate the signal INIT, the signal FACTOR and the signal ITER_FIN. The signal INIT may be used to control initialization of the circuit 112. The initial condition of the circuit 112 may be established at the start of each decoding of a new received codeword. The signal FACTOR may convey a multiplication factor value used to convert the preliminary syndromes into the normal syndromes. The circuit 116 may optionally generate the signal ITER_FIN. The signal ITER_FIN may be used to inform the circuit 112 when an iteration (ITER) of the key equation solving technique has finished (FIN).

The circuit 118 may implement a buffer. The circuit 118 is generally operational to buffer multiple (e.g., 2) received codewords at a time. While the circuit 110 is calculating the preliminary syndromes of a first codeword, the circuit 118 may buffer the first codeword. While the circuits 112 and 114 are calculating the normal syndromes and an error locator polynomial of the first codeword, the circuit 118 may continue to buffer the first codeword and may also buffer a second received codeword.

The circuit 110 may be arranged as a first stage of a pipeline process. A combination of the circuits 112 and 114 may be arranged as a second stage of the pipeline process. If the stages are implemented in hardware, the first stage may accept the received codeword symbol-by-symbol and may provide a set of preliminary syndromes to the second stage. The second stage may calculate an error locator polynomial that provides the positions of errors in the received codeword. For a Reed-Solomon decoder, the second stage may also calculate an error evaluator polynomial that provides the magnitudes of errors in the error positions. A BCH decoder generally does not utilize the error evaluator polynomial. The second stage may then create the errata polynomial from (i) the error locator polynomial (in a BCH decoder) or (ii) the error locator polynomial and error values polynomial pair (in a Reed-Solomon decoder) to the circuit 106. The errata polynomial may be transferred from the second stage to the circuit 106.

Consider a decoder that receives codewords having a codeword length of N and a maximum error limit of T. The symbols of the received codeword are generally elements of a Galois Field $GF(2^d)$. By the theory of BCH codes, N should be a divisor of or the same as $2^d$. The field $GF(2^d)$ may be denoted by F. A primitive element in F may be denoted by $\alpha$. The codeword may be denoted by $C_0, C_1, \ldots, C_{N-1}$. Note that the received codeword may also be considered as a polynomial over F, as follows:

$$C(x) = C_0 + C_1 x + C_2 x^2 + \ldots + C_{N-1} x^{N-1}$$

The syndromes may be 2T elements of F, denoted by $S_i$; $i=0, \ldots, 2T-1$ and calculated as follows:

$$S_i = C(\alpha^{i+1}) = \sum_{j=0}^{N-1} C_j \alpha^{(i+1)j}, \ i = 0, \ldots, 2T-1$$

Figure 3:
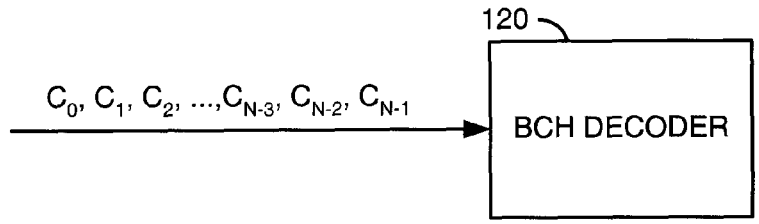
FIG. 3 is a block diagram of an example BCH decoder.

Referring to FIG. 3, a block diagram of an example BCH decoder 120 is shown. Suppose a current codeword length may be k, where k<N. To perform the error correction quickly, the received codeword may be entered into the decoder 120 in a sequence starting from the higher coefficients (e.g., $C_{N-1}$) and ending with the lower coefficients (e.g., $C_0$). In such a case, the last several symbols, or lower coefficients, of the codeword may be considered to be zeros (e.g., $C_0=0, \ldots, C_{N-k-1}=0$) and thus may not actually be transferred through the signal CHANNEL. However, the decoder 120 may still calculate the syndromes based on the non-transferred lower coefficients. Therefore, after each codeword of length k, the decoder 120 may recreate the non-transferred coefficients with N-k zeroes and continue to calculate the syndromes.

Another approach to calculating the syndromes is generally disclosed by Todd K. Moon, "Error Correction Coding: Mathematical Methods and Algorithms", John Wiley & Sons, Inc. Publisher, 2005, pages 253-255, hereby incorporated by reference. The circuit 110 may calculate the syndromes such that if only the symbols $C_{N-1}, \ldots, C_{N-k}$ are passed to the circuit 110, the circuit 110 may calculate preliminary syndromes (e.g., $\hat{S}_i$) as follows:

$$\hat{S}_i = C_{N-k} + C_{N-k+1}\alpha^{(i+1)} + \ldots + C_{N-1}\alpha^{(i+1)(k-1)}$$

$$= \sum_{j=N-k}^{N-1} C_j \alpha^{(i+1)(j-N+k)}, \, i = 0, \ldots, 2T-1$$

The preliminary syndromes may be converted into normal syndromes by the circuit 112. For the whole codeword of length N, since $C_0=0, \ldots, C_{N-k-1}=0$), the normal syndromes (e.g., $S_i$) may be calculated as follows:

$$S_i = C(\alpha^{i+1})$$

$$= \sum_{j=0}^{N-1} C_j \alpha^{(i+1)j}$$

$$= \sum_{j=N-k}^{N-1} C_j \alpha^{(i+1)j}$$

$$= \alpha^{(i+1)(N-k)}(C_{N-k} + C_{N-k+1}\alpha^{i+1} + \ldots + C_{N-1}\alpha^{(i+1)(k-1)})$$

$$= \alpha^{(i+1)(N-k)} \left( \sum_{j=N-k}^{N-1} C_j \alpha^{(i+1)(j-N+k)} \right), \, i = 0, \ldots, 2T-1$$

Therefore, the normal syndromes may be calculated as follows:

$$S_i = \alpha^{(i+1)(N-k)} \hat{S}_i, \, i=0, \ldots, 2T-1$$

Figure 4:
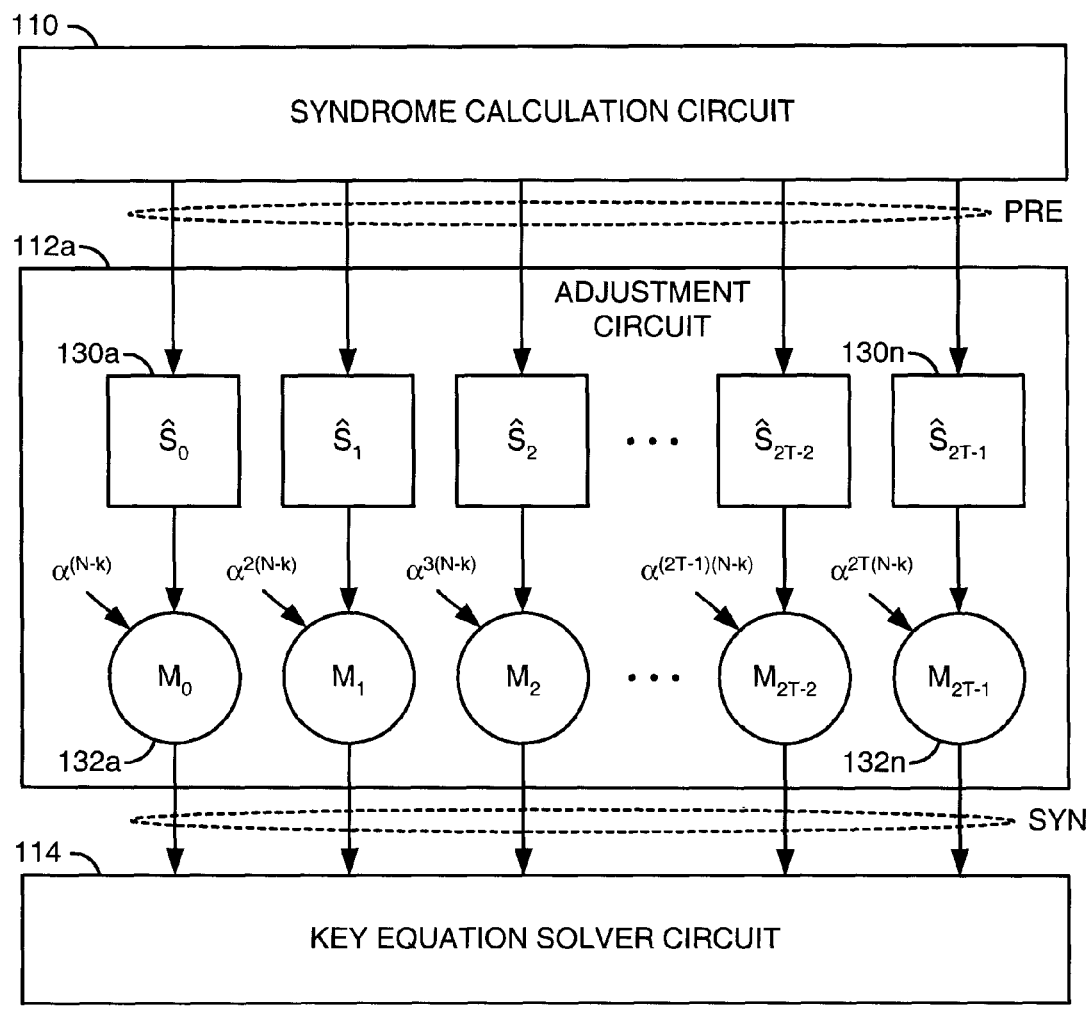
FIG. 4 is a block diagram of a first example implementation of an adjustment circuit.

Referring to FIG. 4, a block diagram illustrating an example implementation of a circuit 112a is shown. The circuit 112a may be an embodiment of the circuit 112. The circuit 112a generally comprises multiple circuits 130a-130n and multiple circuits 132a-132n. The circuits 130a-130n and 132a-132n may represent modules and/or blocks that may be implemented as hardware, software, a combination of hardware and software, or other implementations.

The signal PRE may be presented from the circuit 110 to the circuits 130a-130n. A preliminary syndrome may be transferred by the signal PRE to each respective one of the circuits 130a-130n. Each of the preliminary syndromes may be transferred from the circuits 130a-130n to a respective one of the circuits 132a-132n. Multiplication factor values (e.g., $\alpha^{N-k}$ to $\alpha^{2T(N-k)}$) may be received by the respective circuits 132a-132n. The circuits 132a-132n may collectively present the signal SYN to the circuit 114.

Each of the circuits 130a-130n may implement a register, for a total of 2T registers. The circuits 130a-130n may store the values of the preliminary syndromes $\hat{S}_i$. Each of the circuits 130a-130n may be multiple bits wide.

Each of the circuits 132a-132n may be implemented as a Galois Field multiplier, for a total of 2T GF-multipliers. The circuits 132a-132n may convert the set of preliminary syndromes $\hat{S}_i$, $i=0, \ldots, 2T-1$ into a set of normal syndromes $S_i$. The conversion generally multiplies each of the preliminary syndromes $\hat{S}_i$ by a respective multiplication factor value $\alpha^{(i+1)(N-k)}$.

Some of the key equation solving techniques (e.g., the Berlekamp-Massey technique) may begin operation without a complete set of the normal syndromes being available. Such techniques may be referred to as sequential syndrome load methods or processes. The sequential syndrome load methods may calculate the error locator polynomial by iterations, starting from a polynomial of degree zero (0) and then gradually modifying the polynomial. On the $i^{th}$ iteration, the sequential syndrome load methods generally function using only the syndromes $S_0, \ldots, S_{i-1}$. The symbols $S_i, \ldots, S_{2t-1}$ may be disregarded during the $i^{th}$ iteration. Each iteration may take one or more clock cycles to perform. Where a sequential syndrome load method is implemented by the circuit 114, the syndrome modification may be achieved with less than 2T Galois Field multipliers.

By using the sequential syndrome load method in the circuit 114, a single syndrome modification may be performed by the circuit 112 per iteration by the circuit 114. The single syndrome modification may be performed by the following method:

```
f = α^(N-k);
for(i = 0; i < 2T; i++)
{
    S_i := f Ŝ_i;
    f := f α^(N-k);
}
```

The above method may be refer to as a syndrome modification technique. The syndrome modification technique may be run by the circuit 112 in parallel with the error locator polynomial evaluation performed by the circuit 114. Before the $i^{th}$ iteration of the key equation solving technique, the circuit 112 may provide a correct (normal) syndrome $S_{i-1}$ to the circuit 114. Note that the correct syndromes $S_0, \ldots, S_{i-2}$ may have already been provided by the circuit 112 to the circuit 114. Therefore, the circuit 114 generally has enough data to perform $i^{th}$ iteration of the key equation solving technique. A design of the circuit 112 generally comprises two items: (i) a linear shift register to buffer the preliminary syndromes $\hat{S}_i$, $i=0, \ldots 2T-1$ and (ii) a syndrome modification circuit within the linear shift register. The syndrome modification circuit generally performs the operations that are the body of the above "for" loop of the syndrome modification technique.

Figure 5:
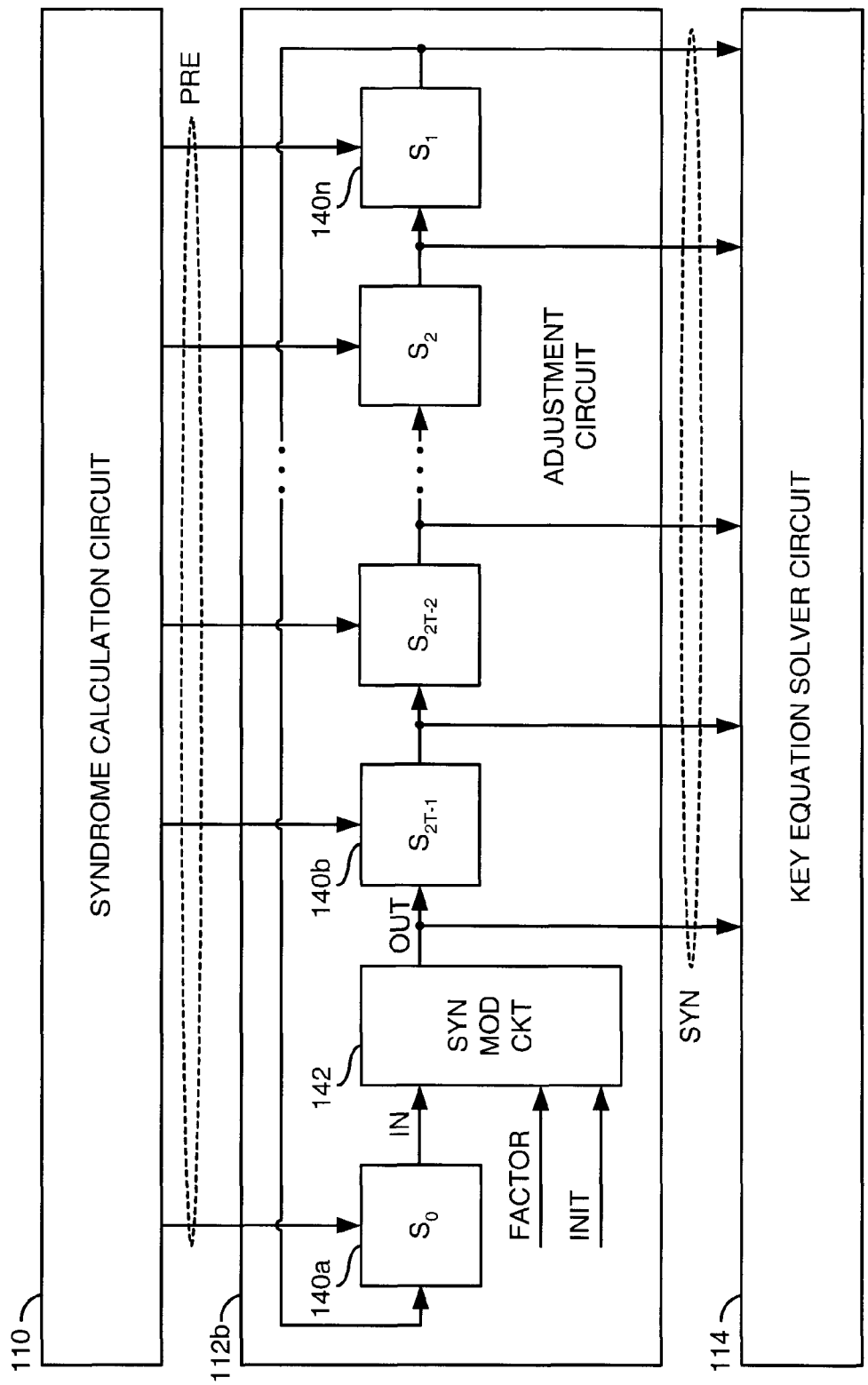
FIG. 5 is a block diagram of a second example implementation of the adjustment circuit.

Referring to FIG. 5, a block diagram of an example implementation of a circuit 112b is shown. The circuit 112b may be an embodiment of the circuit 112. The circuit 112b generally comprises multiple circuits 140a-140n and a circuit 142. The circuits 140a-140n are generally arranged as a linear shift register with an output end feeding back into an input end. The circuit 142 may be incorporated into the linear shift register between two of the circuits 140a-140n (e.g., between 140a and 140b). The circuits 140a-140n and 142 may represent modules and/or blocks that may be implemented as hardware, software, a combination of hardware and software, or other implementations.

The signal PRE may be presented from the circuit 110 to the circuits 140a-140n. A preliminary syndrome may be transferred by the signal PRE to each respective one of the circuits 140a-140n in parallel. Each of the preliminary syndromes may be shifted by the circuits 140b-140n to a neighboring circuit 140c-140n (e.g., the right neighbor). The linear shift register may be arranged to shift a preliminary syndrome to the first register 140a. The linear shift register may also be arranged for the first register 140a to present a preliminary syndrome to the circuit 142 in a signal (e.g., IN). The circuit 142 may present a normal syndrome to the circuit 140b in a signal (e.g., OUT). A multiplication factor value (e.g., $\alpha^{N-k}$) may be received by the circuit 142 via the signal FACTOR. The circuit 142 may also receive the signal INIT, and optionally the signal ITER_FIN. The circuits 142 and 140b-140n may collectively present the signal SYN to the circuit 114, a single normal syndrome from each of the circuits 142 and 140b-140n.

Each of the circuits 140a-140n may implement a shift register, for a total of 2T shift registers. The circuits 140a-140n may initially store the values of the preliminary syndromes $\hat{S}_i$ as received in parallel from the circuit 110. At each iteration, the circuits 140a-140n may shift the preliminary syndromes around the linear shift register to the first circuit 140a. The second circuit 140b may receive the normal syndromes from the circuit 144, one at a time. The syndromes may be shifted around the linear shift register from the circuit 140b to the circuit 140a until all of the normal syndromes have been calculated. Each of the circuits 140a-140n may be multiple bits wide.

The circuit 142 generally implements the syndrome modification circuit. The circuit 142 may be operational to convert the preliminary syndromes into the normal syndromes. In some embodiments, the circuit 142 may be implemented with at most two Galois Field multipliers. In other embodiments, the circuit 142 may be implemented with a single Galois Field multiplier. Other designs of the circuit 142 may be implemented to meet the criteria of a particular application.

The general operation of the circuit 112b may begin with a parallel load of the preliminary syndromes from the circuit 110 into the circuits 140a-140n using the signal PRE. The circuit 140a may present a particular preliminary syndrome (e.g., $\hat{S}_0$) to the circuit 144. Each of the circuits 140b-140n may present the respective just-loaded preliminary syndromes to both (i) a neighboring circuit 140a and 140c-140n and (ii) the circuit 114. The circuit 142 may calculate a first normal syndrome based on the particular preliminary syndrome and an initial multiplication factor value received in the signal FACTOR. The first normal syndrome may be presented to both (i) the circuit 140b and (ii) the circuit 114. The linear shift register of the circuit 112b may then be cycled once resulting in a next preliminary syndrome (e.g., $\hat{S}_1$) to be shifted into the circuit 142. The circuit 142 may calculate a next normal syndrome, which is presented to the circuit 114 and the circuit 140b. Iterations of the linear shift register may continue until all of the normal syndromes have been calculated by the circuit 142 and are available to the circuit 114.

Figure 6:
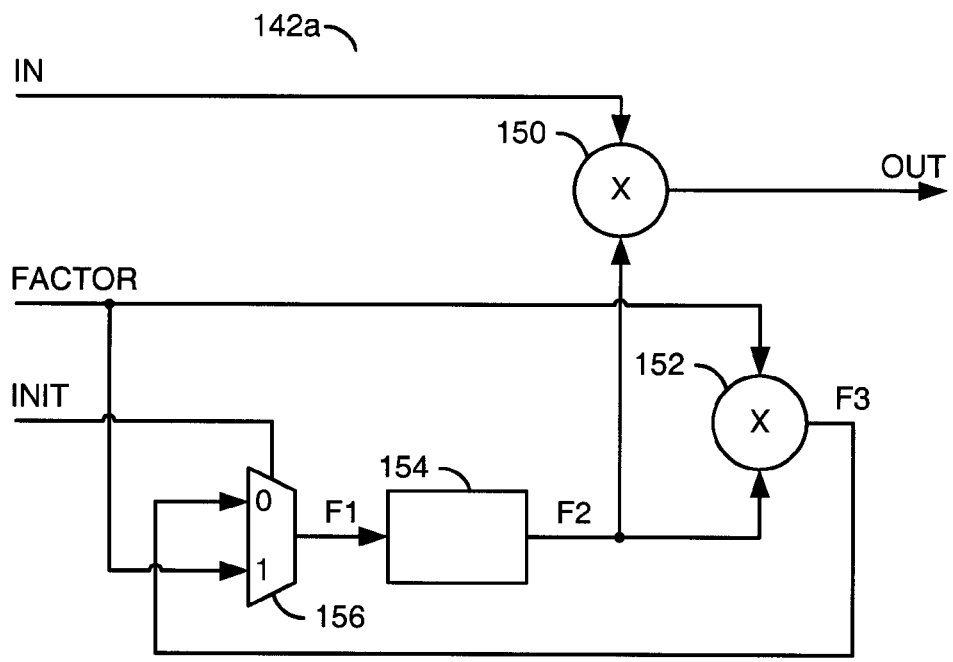
FIG. 6 is a block diagram of a first example implementation of a syndrome modification circuit.

Referring to FIG. 6, a block diagram of an example implementation of a circuit 142a is shown. The circuit 142a may be an embodiment of the circuit 142. The circuit 142a generally comprises a circuit 150, a circuit 152, a circuit 154 and a circuit 156. The circuits 150 to 156 may represent modules and/or blocks that may be implemented as hardware, software, a combination of hardware and software, or other implementations.

The signal IN may be received by the circuit 150. The circuit 150 may generate the signal OUT. The signal FACTOR may be received by the circuits 150 and 156. The signal INIT may be received by the circuit 156. A signal (e.g., F1) may be presented from the circuit 156 to the circuit 154. The circuit 154 may generate and present a signal (e.g., F2) to the circuits 150 and 152. A signal (e.g., F3) may be generated by the circuit 152 and presented to the circuit 156.

The circuit 150 may be implemented as a Galois Field multiplier. The circuit 150 is generally operational to calculate a normal syndrome value in the signal OUT by multiplying a preliminary syndrome value of the signal IN and a multiplication factor value of the signal F2. The multiplication may be performed in a single clock cycle.

The circuit 152 may be implemented as a Galois Field multiplier. The circuit 152 is generally operational to calculate an updated multiplication factor value in the signal F3 by multiplying an initial multiplication factor value (e.g., $\alpha^{(N-k)}$) of the signal FACTOR and a current multiplication factor value of the signal F2. The multiplication may be performed in a single clock cycle.

The circuit 154 generally implements a register. The circuit 154 may buffer the current multiplication factor value as received in the signal F1. The current multiplication factor value may also be presented from the circuit 154 to the circuits 150 and 152 in the signal F2. During the syndrome modification process, the circuit 154 generally keeps the value of the current multiplication factor (e.g., $\alpha^{(i-1)(N-k)}$). After initialization, the circuit 154 may store a current multiplication factor value (e.g., $\beta^{(N-k)}$).

The circuit 156 may implement a multiplexer. The circuit 156 is generally operational to multiplex the signal FACTOR and the signal F3 into the signal F1. The multiplexing may be controlled by the signal INIT.

The signal INIT may be used to initialize the circuit 142. The signal INIT may be asserted to a first state (e.g., a logical high or one state) for a given clock cycle before the circuit 142 starts modifying the syndromes. While the signal INIT is asserted, the circuit 154 may route the signal FACTOR to the signal F1. The given clock cycle may be a clock cycle when the circuit 110 finishes calculating the preliminary syndromes, or some moment earlier. The initial multiplication factor value (e.g., $\alpha^{(N-k)}$) should remain available in the signal FACTOR starting from the given clock cycle and during all the working time of the circuit 142. While the signal INIT is deasserted (e.g., a logical low or zero state), the circuit 154 may route the signal F3 to the signal F1.

In operation, the preliminary syndromes may be parallel loaded into the circuits 140a-140n. The circuit 142 may be considered to start when a first preliminary syndrome (e.g., $\hat{S}_0$) is received from the circuit 140a. The circuit 142 may be considered to finish when a last correct syndrome $S_{2T-1}$ is available. The clock cycles between the start and finish are generally referred to as the working time of the circuit 142.

Generally, the circuit 142 may start on any clock cycle after the circuit 110 has finished and all of the preliminary syndromes are stored in the circuits 140a-140n. Before or at the starting moment, the circuit 142 should be initialized by setting the initial multiplication factor value in the signal FACTOR and asserting the signal INIT for at least a single clock cycle. The initialization may be done during the working time of circuit 110 or later. The signal INIT should be deasserted before the circuit 142 starts and the value $\alpha^{(N-k)}$ should be kept on the signal FACTOR during all of the working time of the circuit 142.

When the preliminary syndromes are loaded into the linear shift register, the circuit 142 may convert an initial preliminary syndrome $\hat{S}_0$ to an initial syndrome $S_0$. Afterwards, a first iteration of key equation solving technique may be launched in the circuit 114. At the same time, the syndromes may be shifted in the linear shift register in a direction pointed by arrows. Thus, a correct syndrome $S_0$ may be received by the circuit 114 for a first key equation solving technique iteration and a preliminary syndrome $\hat{S}_1$ is received by the circuit 142. By the end of first iteration of the key equation solving technique, the circuit 142 may have prepared a correct syndrome $S_1$. Afterwards, a second iteration of key equation solving technique may be launched and the syndromes may be shifted in linear shift register. The second iteration of the key equation solving technique may consume syndromes $S_1$ and $S_0$. By the end of the $i^{th}$ iteration of the key equation solving technique, the linear shift register may present i+1 correct syndromes from the output ports of the circuit 142 and the circuits 140b-140₂T−1. On a next clock cycle, the circuit 114 generally starts an $(i+1)^{th}$ iteration of the key equation solving technique using the available normal syndromes and the syndromes may be shifted in linear shift register. The iterations and shifting may continue until key equation solving technique stops evaluating the error locator polynomial.

Figure 7:
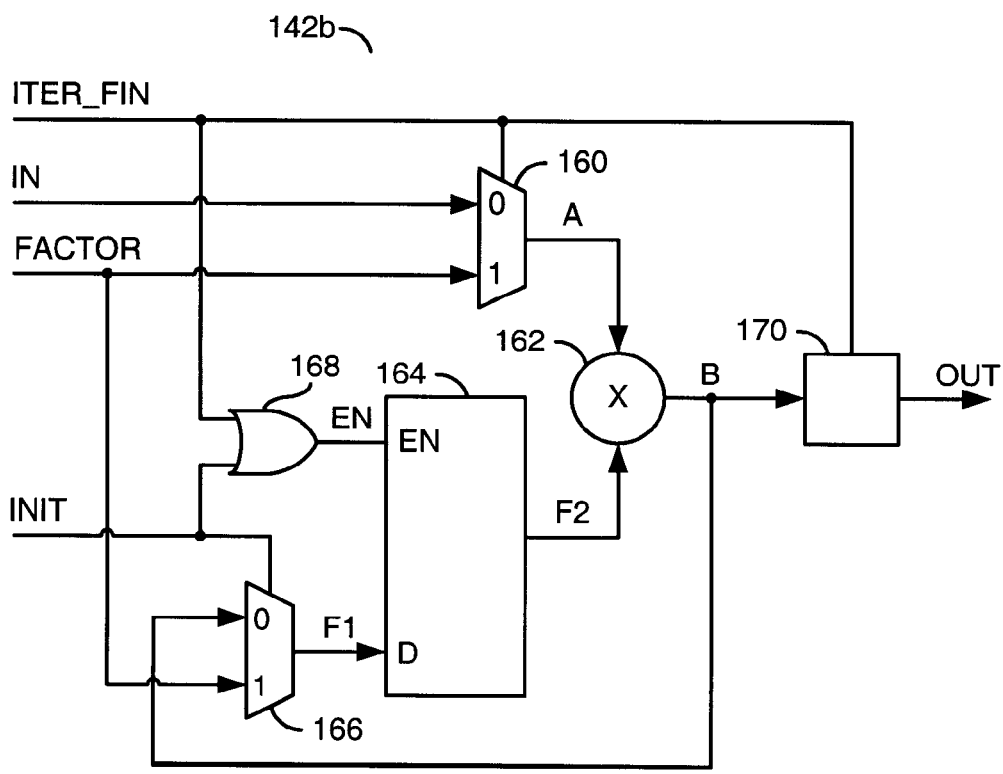
FIG. 7 is a block diagram of a second example implementation of the syndrome modification circuit.

Referring to FIG. 7, a block diagram of an example implementation of a circuit 142b is shown. The circuit 142b may be another embodiment of the circuit 142. If a single iteration of the key equation solving technique takes more than a single clock cycle, the circuit 142 may be further simplified to the circuit 142b containing only a single Galois field multiplier. The circuit 142b generally comprises a circuit 160, a circuit 162, a circuit 164, a circuit 166, a circuit 168 and an optional circuit 170. The circuits 160 to 170 may represent modules and/or blocks that may be implemented as hardware, software, a combination of hardware and software, or other implementations.

The signal IN may be received by the circuit 160. The circuit 160 may generate a signal (e.g., A). The circuit 162 may generate a signal (e.g., B) that is received by the circuits 166 and 170. The signal FACTOR may be received by the circuits 160 and 166. The signal INIT may be received by the circuits 166 and 168. The signal F1 may be presented from the circuit 166 to the circuit 164. The circuit 164 may generate and present the signal F2 to the circuit 162. A signal (e.g., EN) may be generated by the circuit 168 and presented to the circuit 164. The signal ITER_FIN may be received by the circuits 160, 168 and 170. The signal OUT may be generated by the circuit 170.

The circuit 160 may implement a multiplexer. The circuit 160 is generally operational to multiplex the signal PRE and the signal FACTOR into the intermediate signal A. The multiplexing may be controlled by the signal ITER_FIN.

The circuit 162 may be implemented as a Galois Field multiplier. The circuit 162 is generally operational to calculate a normal syndrome value in the signal B by multiplying a preliminary syndrome value of the signal A and a multiplication factor value of the signal F2 while the signal ITER_FIN is deasserted. The circuit 162 may also be operational to calculate an updated multiplication factor value in the signal B by multiplying an initial multiplication factor value (e.g., $\alpha^{(N-k)}$) of the signal FACTOR and a current multiplication factor value of the signal F2. The multiplication may be performed in a single clock cycle.

The circuit 164 generally implements a controlled register. The circuit 164 may buffer the current multiplication factor value as received in the signal F1. Capturing of a value on the signal F1 may be controlled by the enable signal EN. While the signal EN is asserted (e.g., the logical high or one state) the circuit 164 may capture values from the signal F1. While the signal EN is disabled (e.g., the logical low or zero state), the circuit 164 may ignore the signal F1. The current multiplication factor value may be presented from the circuit 164 to the circuit 162 in the signal F2. During the syndrome modification process, the circuit 164 generally keeps the value of the current multiplication factor (e.g., $\alpha^{(i-1)(N-k)}$). After initialization, the circuit 164 may store a current multiplication factor value (e.g., $\alpha^{(N-k)}$).

The circuit 166 may implement a multiplexer. The circuit 166 is generally operational to multiplex the signal FACTOR and the signal B into the signal F1. The multiplexing may be controlled by the signal INIT.

The circuit 168 may implement a two-input Boolean OR logic gate. The circuit 168 may generate the signal EN by logically OR'ing the signal ITER_FIN and the signal INIT. While either or both of the signals ITER_FIN and/or INIT are asserted (e.g., the logical high or one state), the circuit 168 may enable the circuit 164 to capture a value in the signal F1 at a data input (e.g., D). While both of the signals ITER_FIN and INIT are deasserted (e.g., the logical low or zero state), the circuit 168 may disable the circuit 164 from capturing the value on the signal F1.

The circuit 170 may implement a register. The circuit 170 may capture a normal syndrome from the signal B when the signal ITER_FIN transitions from asserted to deasserted and ignore the signal B at other times. The circuit 170 may present the buffered syndrome in the signal OUT to the circuits 140b and 114. In some embodiments, the circuit 170 may be disposed in the linear shift register between the circuit 142b and the circuit 140b.

The signal ITER_FIN may be asserted by the circuit 116 on a last clock cycle of each key equation solver technique iteration. The signal ITER_FIN may be deasserted by the circuit 116 on all other clock cycles of each key equation solving technique iteration. While the signal ITER_FIN is deasserted, circuit 162 may be used to calculate a correct syndrome S. While the signal ITER_FIN is asserted, the circuit 162 may be used to modify the value of the current multiplication factor. The circuit 142b may be initialized in the same way as the circuit 142a.

The functions performed by the diagrams of FIGS. 1-7 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products) or by interconnecting an appropriate network of conventional component circuits, as is described herein, modifications of which will be readily apparent to those skilled in the art(s).

The present invention thus may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (electronically programmable ROMs), EEPROMs (electronically erasable ROMs), UVPROM (ultra-violet erasable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, storage and/or playback devices, video recording, storage and/or playback devices, game platforms, peripherals and/or multi-chip modules. Those skilled in the relevant art(s) would understand that the elements of the invention may be implemented in other types of devices to meet the criteria of a particular application.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a first circuit configured to calculate a plurality of preliminary syndromes from a plurality of received symbols;
   a second circuit configured to calculate a plurality of normal syndromes by modifying said preliminary syndromes using at most two Galois Field multipliers, and
   a third circuit configured to calculate an errata polynomial based on said normal syndromes.

2. The apparatus according to claim 1, wherein said second circuit comprises a plurality of shift registers configured to received said preliminary syndromes in parallel from said first circuit.

3. The apparatus according to claim 1, wherein said second circuit comprises a modification circuit configured to calculate one of said normal syndromes based on one of said preliminary syndromes in a first of a plurality of shift registers.

4. The apparatus according to claim 3, wherein said one normal syndrome is transferred from said modification circuit to said third circuit.

5. The apparatus according to claim 1, wherein said second circuit comprises a plurality of shift registers and a modification circuit connected to shift (i) said preliminary syndromes by one of said shift registers, except one of said preliminary syndromes in a first of said shift registers and (ii) one of said normal syndromes from said modification circuit to a second of said shift registers.

6. The apparatus according to claim 1, wherein said second circuit comprises (i) a register configured to buffer a multiplication factor and (ii) a first Galois Field multiplier configured to calculate said one normal syndrome by multiplying one of said preliminary syndromes by said multiplication factor.

7. The apparatus according to claim 6, wherein said second circuit further comprises a second Galois Field multiplier configured to calculated an updated version of said multiplication factor.

8. The apparatus according to claim 6, wherein said first Galois field multiplier is further configured to alternate between calculating (i) said one normal syndrome and (ii) an updated version of said multiplication factor.

9. The apparatus according to claim 1, further comprising a fourth circuit configured to calculate a plurality of recovered symbols by correcting said received symbols with said errata polynomial.

10. The apparatus according to claim 1, wherein said apparatus forms at least one of (i) a BCH decoder and (ii) a Reed-Solomon decoder.

11. A method for decoding with syndrome modification, comprising the steps of:
    (A) calculating a plurality of preliminary syndromes from a plurality of received symbols;
    (B) calculating a plurality of normal syndromes by modifying said preliminary syndromes using at most two Galois Field multipliers, and
    (C) calculating an errata polynomial based on said normal syndromes using a solver circuit.

12. The method of claim 11, wherein step (B) comprises the sub-step of:
    loading said preliminary syndromes in parallel into a plurality of shift registers.

13. The method according to claim 11, wherein step (B) comprises the sub-step of:
    calculating one of said normal syndromes in a modification circuit based on one of said preliminary syndromes in a first of a plurality of shift registers.

14. The method according to claim 13, wherein step (B) further comprises the sub-step of:
    transferring said one normal syndrome from said modification circuit to said solver circuit.

15. The method according to claim 11, wherein step (B) comprises the sub-step of:
    shifting (i) said preliminary syndromes by one of a plurality of shift registers, except one of said preliminary syndromes in a first of said shift resisters, and (ii) one of said normal syndromes from a modification circuit to a second of said shift registers.

16. The method according to claim 15, wherein said shifting is repeated until all of said normal syndromes have been calculated.

17. The method according to claim 11, wherein said at most two Galois field multipliers is a single Galois Field multiplier.

18. The method according to claim 11, wherein step (C) calculates an error locator polynomial in a plurality of iterations starting from a polynomial of degree zero.

19. The method according to claim 11, further comprising the step of:
    calculating a plurality of recovered symbols by correcting said received symbols with said errata polynomial.

20. An apparatus comprising:
    means for calculating a plurality of preliminary syndromes from a plurality of received symbols;
    means for calculating a plurality of normal syndromes by modifying said preliminary syndromes using at most two Galois Field multipliers; and
    means for calculating an errata polynomial based on said normal syndromes.

* * * * *